(12) United States Patent  (10) Patent No.: US 8,120,417 B2
Kannan et al.  (45) Date of Patent: Feb. 21, 2012

(54) TRANSFER-FUNCTION CONTROL IN AN ACTIVE FILTER

(75) Inventors: Anand Kannan, Bangalore (IN); Ranjit Kumar Guntreddi, Bangalore (IN); Karthikeyan Reddy, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/507,103

(22) Filed: Jul. 22, 2009

(65) Prior Publication Data
US 2011/0012678 A1  Jan. 20, 2011

(30) Foreign Application Priority Data
Jul. 20, 2009 (IN) ............ 1707/CHE/2009

(51) Int. Cl.
*H03K 5/00* (2006.01)
(52) U.S. Cl. ..................... 327/552; 327/557
(58) Field of Classification Search ........... 327/551–559
See application file for complete search history.

(56) References Cited

U.S. PATENT DOCUMENTS

| | | | | |
|---|---|---|---|---|
| 6,369,645 B1 * | 4/2002 | Takahashi | ............ | 327/558 |
| 6,670,846 B2 * | 12/2003 | Yamamoto et al. | ............ | 327/554 |
| 6,680,645 B2 * | 1/2004 | Greitschus et al. | ............ | 327/553 |
| 7,038,531 B2 * | 5/2006 | Cavazzoni | ............ | 327/552 |
| 7,132,881 B2 * | 11/2006 | Adan | ............ | 327/554 |

* cited by examiner

*Primary Examiner* — Dinh T. Le
(74) *Attorney, Agent, or Firm* — Ronald O. Neerings; Wade J. Brady, III; Frederick J. Telecky, Jr.

(57) ABSTRACT

A filter circuit includes a differential amplifier circuit to provide a number of poles including a dominant pole, and a feedback circuit to feed a portion of an output of the differential amplifier circuit to an input of the differential amplifier circuit. The feedback circuit includes a feedback resistor and a feedback capacitor to provide a controllable increase in an order of a transfer function of the filter circuit along with non-dominant poles of the differential amplifier circuit coupled in parallel with the feedback resistor. Coefficients of a transfer function of the differential amplifier circuit are forced to substantially depend solely on one or more of a plurality of passive circuit elements, the feedback resistor, and the feedback capacitor to control a dependence of the transfer function of the filter circuit on a gain of the differential amplifier circuit and poles of the differential amplifier circuit.

18 Claims, 6 Drawing Sheets

TRANSFER-FUNCTION CONTROL IN AN ACTIVE FILTER

CLAIM OF PRIORITY

This U.S. patent application claims priority from Indian patent application number 1707/CHE/2009 titled "TRANSFER-FUNCTION CONTROL IN AN ACTIVE FILTER" filed on Jul. 20, 2009.

FIELD OF TECHNOLOGY

Embodiments of the disclosure relate generally to continuous-time filters, and, more particularly, to transfer function control in active filters.

BACKGROUND

Continuous-time filters find use in applications involving, but not limited to, disk drive readers, data converters, and wireless radio frequency (RF) transceivers. The monolithic integration hurdle, previously posed by bulky passive RLC filters, was overcome through the evolution of semiconductor devices that enabled higher order filters to be implemented using RC (R—resistor, and C—capacitor) and active elements such as transistors, thereby eliminating the need for bulky inductors (L).

Integrated analog filters using the abovementioned active elements, or alternately, active filters, have found use in radio frequency (RF) transceivers used in cellular communication. Specifically, active filters have been used for band selection and jammer rejection in RF transceivers. Target filtering applications such as wireless transceivers may also require the integration of multiple radios on a single chip or a system. The presence of multiple radios may require high orders of filtering to suppress interference from one radio to another. For example, harmonic frequencies of one radio may be close to the signal band of another radio. The area savings may go hand in hand with power savings in integrated systems (e.g., System-on-Chip (SoC)) that demand smaller space and low power consumption.

SUMMARY

Disclosed are a method, an apparatus, and a system to provide power and area savings in active filters used in filtering applications.

In one aspect, a filter circuit is disclosed. The filter circuit includes a differential amplifier circuit to provide a number of poles including a dominant pole, and a feedback circuit to feed a portion of an output of the differential amplifier circuit to an input of the differential amplifier circuit. The feedback circuit includes a feedback resistor and a feedback capacitor to provide a controllable increase in an order of a transfer function of the filter circuit along with non-dominant poles of the differential amplifier circuit coupled in parallel with the feedback resistor. The filter circuit also includes a number of passive circuit elements that include one or more of a resistor and a capacitor. Coefficients of a transfer function of the differential amplifier circuit are forced to substantially depend solely on one or more of the number of passive circuit elements, the feedback resistor, and the feedback capacitor to control a dependence of the transfer function of the filter circuit on a gain of the differential amplifier circuit and poles of the differential amplifier circuit.

In another aspect, a method of filtering is disclosed. The method of filtering includes forming a filter circuit by feeding a portion of an output of a differential amplifier circuit providing a number of poles including a dominant pole to an input of the differential amplifier circuit through a feedback circuit including a feedback capacitor coupled in parallel with a feedback resistor. The method also includes using the feedback capacitor and non-dominant poles of the differential amplifier circuit to provide a controllable increase in an order of a transfer function of the filter circuit. Further, the method includes forcing coefficients of a transfer function of the differential amplifier circuit to substantially depend solely on one or more of the feedback resistor, the feedback capacitor, and constituent passive circuit elements thereof to control a dependence of the transfer function of the filter circuit on a gain of the differential amplifier circuit and poles of the differential amplifier circuit. The passive circuit elements include one or more of a resistor and a capacitor.

In yet another aspect, an integrated circuit is disclosed. The integrated circuit includes an electrical circuit and a filter circuit to filter an output of the electrical circuit. The filter circuit includes a differential amplifier circuit to provide a number of poles including a dominant pole, and a feedback circuit to feed a portion of an output of the differential amplifier circuit to an input of the differential amplifier circuit. The feedback circuit includes a feedback resistor and a feedback capacitor to provide a controllable increase in an order of a transfer function of the filter circuit along with non-dominant poles of the differential amplifier circuit coupled in parallel with the feedback resistor. The filter circuit also includes a number of passive circuit elements that include one or more of a resistor and a capacitor. Coefficients of a transfer function of the differential amplifier circuit are forced to substantially depend solely on one or more of the number of passive circuit elements, the feedback resistor, and the feedback capacitor to control a dependence of the transfer function of the filter circuit on a gain of the differential amplifier circuit and poles of the differential amplifier circuit.

The methods and systems disclosed herein may be implemented in any means for achieving various aspects, and may be executed in a form of a machine-readable medium embodying a set of instructions that, when executed by a machine, cause the machine to perform any of the operations disclosed herein. Other features will be apparent from the accompanying drawings and from the detailed description that follows.

BRIEF DESCRIPTION OF THE VIEWS OF DRAWINGS

The embodiments of the disclosure are illustrated by way of example and not limitation in the figures of the accompanying drawings, in which like references indicate similar elements and in which.

Other features of the present embodiments will be apparent from the accompanying drawings and from the detailed description that follows.

DETAILED DESCRIPTION

Disclosed are a method, an apparatus, and a system to provide power savings and area savings in active filters used in filtering applications. Although the present embodiments have been described with reference to specific example embodiments, it will be evident that various modifications and changes may be made to these embodiments without departing from the broader spirit and scope of the various embodiments.

In general, example embodiments discussed below provide a filtering system to save power and area in applications involving the filtering system. Examples of filtering systems include, but are not limited to, wireless transceivers, mobile disk drives, and loop filters.

Various exemplary embodiments will now be described with reference to the accompanying figures.

Figure 1:
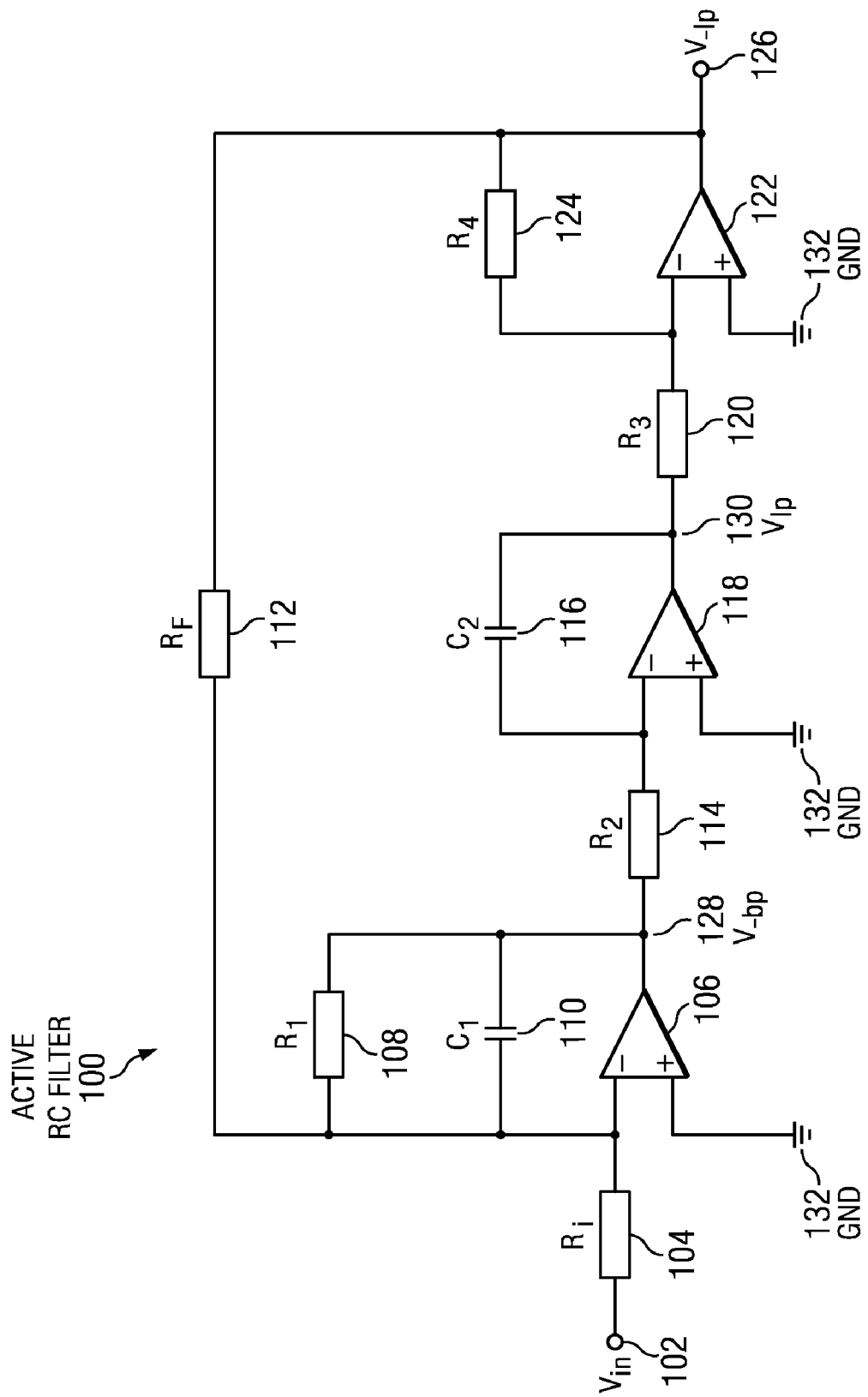
FIG. 1 is an active RC filter using operational amplifiers, in accordance with one or more embodiments.

FIG. 1 illustrates an active RC filter 100 configuration using operational amplifiers (op-amps). Specifically, FIG. 1 shows a Tow Thomas biquad filter as an example of the active RC filter 100 configuration. The active RC filter 100 may include three op-amps (106, 118, 122), with $R_i$, $R_2$, and $R_3$ being the input resistors of op-amps 106, 118, and 122 respectively. The op-amp 106 may have a resistor $R_1$ 108 in parallel with a capacitor $C_1$ 110 in a feedback loop thereof. The capacitor $C_1$ 110 may add a zero into the loop gain of the op-amp 106. In the case of op-amps 118 and 122, there may be a capacitor $C_2$ 116 and a resistor R.sub.3 124 in respective feedback loops thereof, as shown in FIG. 1. The resistor R 112 is the feedback resistor for the entire op-amp chain. Inputs to the op-amps (106, 118, and 122) may be given to the respective inverting terminals, and the respective non-inverting terminals of the op-amp may serve as the ground terminals (GND) 132. The op-amp 106 may serve as a lossy integrator, the op-amp 118 may serve as a lossless integrator, and the op-amp 122 may serve as an inverter.

With regard to the active RC filter 100, $V_{in}$ 102 is the input terminal, and depending on the locations of the output terminal, the active RC filter 100 may serve as an inverting band-pass filter, inverting low-pass filter or a non-inverting low-pass filter. For example, if the output terminal were to be at $V_{-bp}$ 128, then the active RC filter 100 may be an inverting band-pass filter. If the output terminal were to be at $V_{1p}$ 130, then the active RC filter 100 may be a non-inverting low-pass filter, and if the output terminal were to be at $V_{-1p}$ 126, then the active RC filter 100 may be an inverting low-pass filter. Interchanging the order of the integrator op-amp 118 and the inverter op-amp 122 may provide for a non-inverting band-pass filter to be obtained at the output of the inverter op-amp 122. In order to reduce costs of production, the inverter op-amp 122 may be removed in a fully differential implementation of the active RC filter 100.

In the active RC filter 100 of FIG. 1, the signal swing seen by the input node of every op-amp (106, 118, and 122) may be less, which ensures a high linearity of the active RC filter 100. The filter poles, the frequency response, and the bandwidth (BW) may be decided by the passive elements (R and C) alone, thereby allowing for precise tuning of the filter poles and BW. However, the active RC filter 100 may require near-ideal constituent op-amps (106, 118, and 122) to achieve the desired frequency response. This implies that the op-amps (106, 118, and 122) may need to have high gain and high BW, which, along with parasitic poles of the op-amps (106, 118, and 122) affecting the frequency response of the active RC filter 100, may cause high power to be dissipated in the active RC filter 100. A significant amount of power may be used to wideband the op-amps (106, 118, and 122). In battery-operated, low power applications, circuit lifetime may decrease due to the current consumption of the aforementioned wideband op-amps (106, 118, and 122).

Considering the active RC filter 100 of FIG. 1, two wide-band op-amps (neglecting the inverter op-amp 122 that merely serves to invert inputs thereof) are needed to realize a second-order transfer function. This shows that in order to realize a filter of order N, N wideband op-amps may be required. In view of the area and power requirements, the active RC filter 100 may be incompatible with the needs of battery-operated integrated systems.

Figure 2:
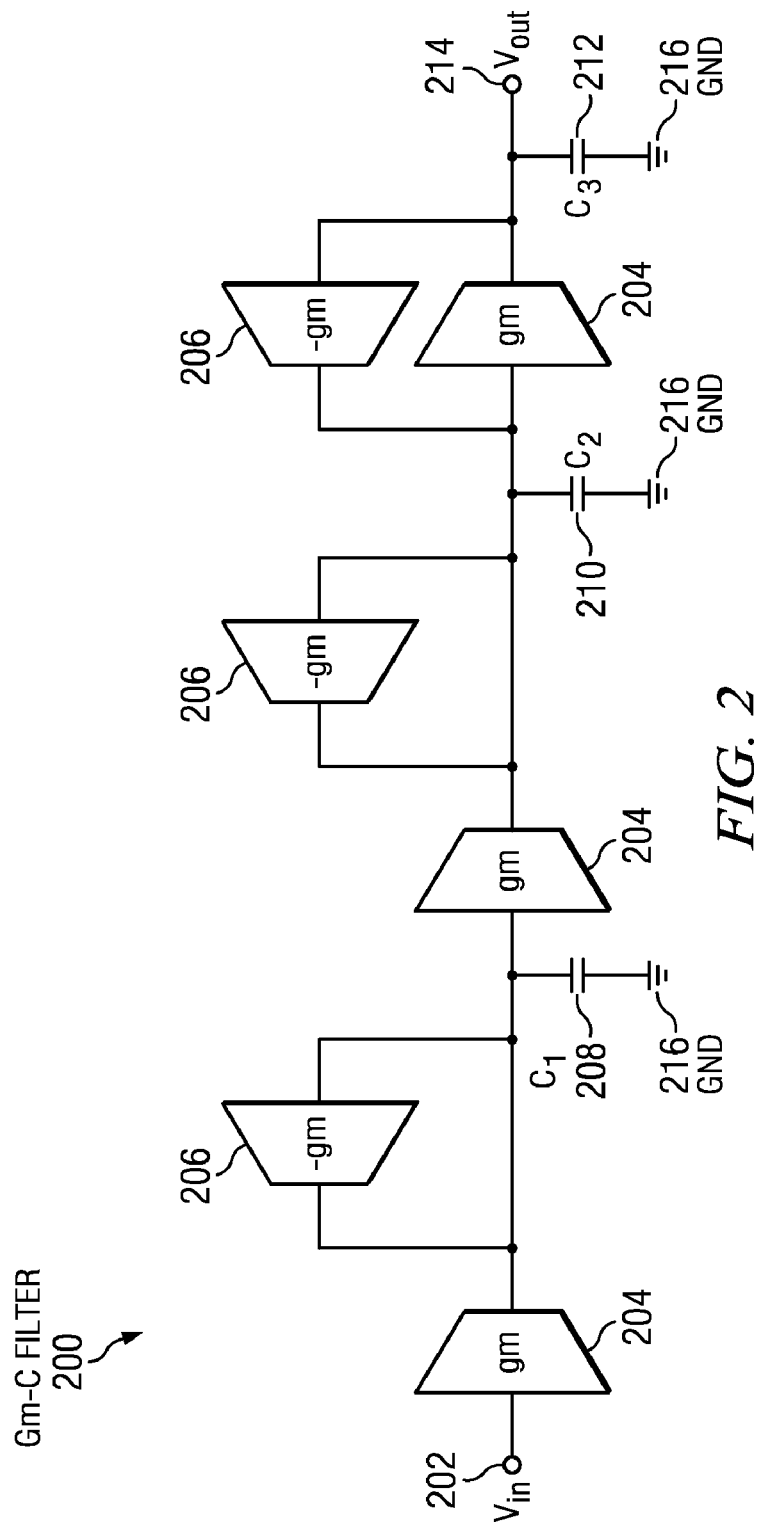
FIG. 2 is a transconductance-capacitance (gm-C) filter, in accordance with one or more embodiments.

FIG. 2 illustrates a transconductance-capacitance (gm-C) filter 200 configuration. Specifically, FIG. 2 illustrates a third-order Butterworth low-pass gm-C filter as an example of the gm-C filter 200 configuration. The gm-C filter 200 includes Operational Transconductance Amplifiers (OTAs) as building blocks. FIG. 2 illustrates six gm cells (gm 204, -gm 206), along with requisite capacitors ($C_1$ 208, $C_2$ 210, $C_3$ 212), being required to realize a third-order transfer function. The single-ended gm-C filter configuration is used for illustrative purposes. $V_{in}$ 202 is the input terminal, $V_{out}$ 214 is the output terminal, and GND 216 is the ground terminal.

The poles of constituent OTAs of a gm-C filter 200 may not be parasitic, and, therefore, the gm-C filter 200 may consume less power compared to the active RC filter of FIG. 1. The filter poles may be governed by an active parameter, i.e., gm, which forbids power-hungry wideband amplifier block requirements. The filter BW may be easily controlled by tuning the gm cells (gm 204, -gm 206) and the capacitance values of the capacitors ($C_1$ 208, $C_2$ 210, $C_3$ 212). However, the input to the gm-C cells (gm 204, -gm 206) may see a large swing, leading to a limited linearity of the gm-C filter 200. Further, as discussed above, six gm-C cells may be required to realize a third-order transfer function, which implies that the gm-C filter 200 may not provide for large area savings.

Figures 3A, 3B:
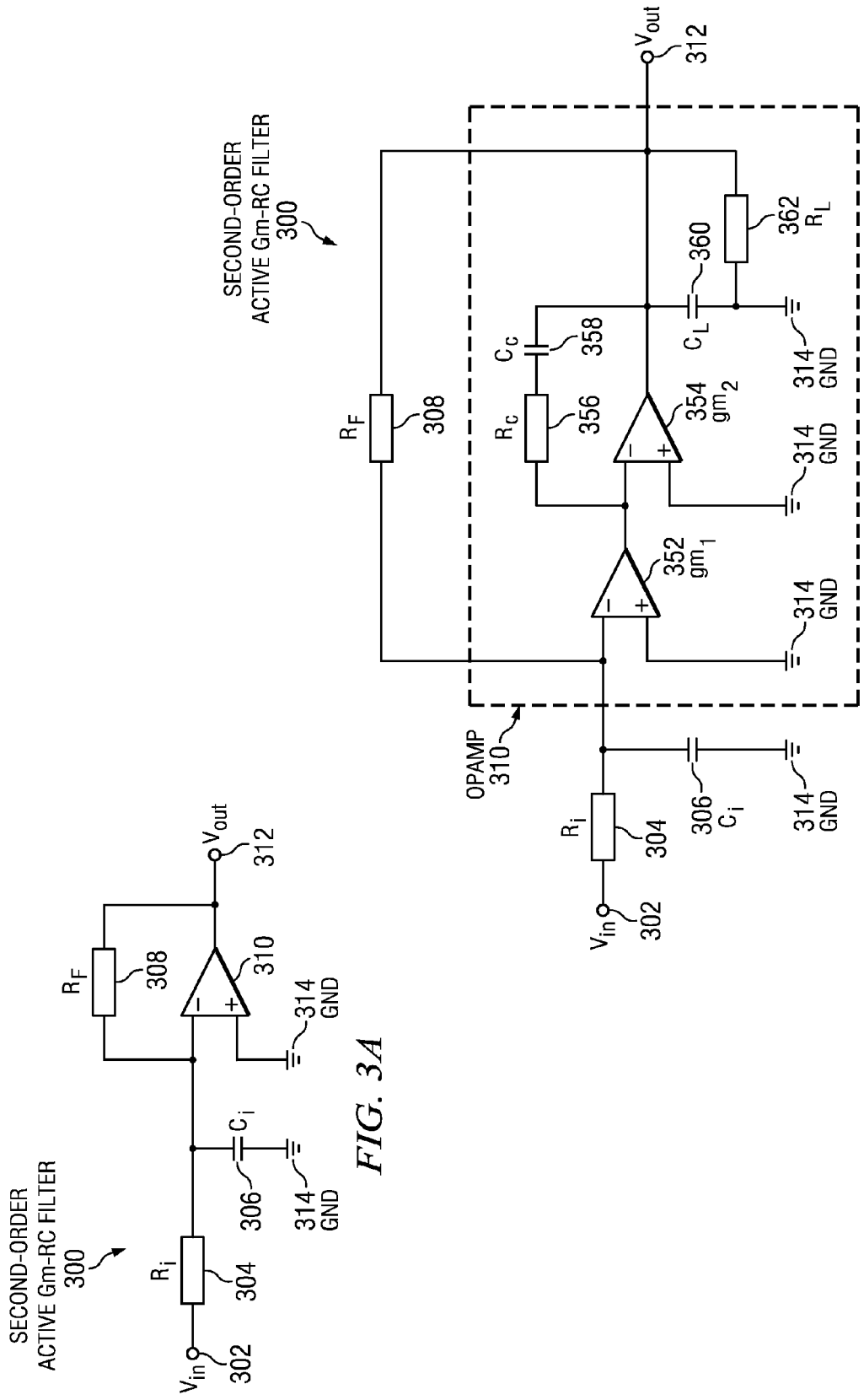
FIG. 3A is a second-order active gm-RC filter implemented with a single operational amplifier in a biquad configuration, in accordance with one or more embodiments.
FIG. 3B is the active gm-RC filter of FIG. 3A, with a two-stage constitution of the operational amplifier.

FIG. 3A illustrates a second-order active gm-RC filter 300 implemented with a single op-amp in a biquad configuration. Specifically, the active gm-RC filter 300 includes an op-amp 310, an input resistor $R_1$ 304, an input capacitance $C_1$ 306, and a feedback resistor $R_f$ 308. The input terminal is $V_{in}$ 302, the output terminal is $V_{out}$ 312, and GND 314 is the ground terminal. The active gm-RC filter 300 provides combined benefits of both the active RC. filter 100 of FIG. 1 and the gm-C filter of FIG. 2. The closed-loop poles of the active gm-RC filter 300 may depend on the op-amp 310 pole and the pole due to $R_1$ 304 and $C_i$ 306. Due to the presence of negative feedback, the swing at the input node of the op-amp 310 may he less for inhand signals, thereby providing for good linearity. A virtual ground may be ensured at the input of the op-amp 310 in the signal band. $R_1$ 304 and $C_i$ 306 may provide first order rejection at the input of the op-amp 310, which provides for good out-of-band linearity.

The op-amp 310 may be an effective single-pole amplifier, which may typically be a two stage amplifier, with the second pole wide-banded. The two stages may be provided to realize a high direct current (DC) gain. The transfer function, A(s), of a dominant-pole compensated op-amp may be given by example Equation 1 as:

$$A(s) = \frac{A_0}{\left(1 + \frac{s}{p_1}\right)}, \quad (1)$$

where $A_0$ is the open loop gain of the op-amp, $p_1 = 1/R_1C_1$ is the dominant pole, and s is the Laplace variable.

The unity-gain frequency, $\omega_u$, of the dominant-pole compensated op-amp may be expressed in example Equation 2 as:

$$\omega_u = A_0 p_1 \quad (2)$$

FIG. 3B shows the active gm-RC filter 300 of FIG. 3A, with a two-stage constitution of the op-amp 310. The op-amp 310 may include an input transconductance $g_{m1}$ 352 cell and an output transconductance $g_{m2}$ 354 cell. The output stage of which the output transconductance $g_{m2}$ 354 cell is a component may further include a Miller compensation network of a resistor $R_C$ 356 and a capacitor $C_c$ 358. The load resistor $R_L$ 362 and the load capacitor $C_L$ 360 at the output stage may represent load contributions of external circuits (e.g., circuits connected in cascade with the op-amp 310).

The abovementioned Miller compensation network may be provided to push the second pole $$\frac{g_{m2}}{C_L}$$

far away in order to provide for a truly dominant single-pole system. As a single op-amp may be used to synthesize a second-order transfer function, the active gm-RC filter 300 may consume lesser power than active RC filters that include two op-amps to realize a second-order transfer function. However, in order to push the aforementioned second pole far away, extra power may be required to increase $g_{m2}$.

The BW and Quality (Q) factor of the active gm-RC filter 300 of FIG. 3A may be expressed in example Equations 3 and 4 as:

$$BW = \sqrt{\frac{A_0 p_1}{C_1 R_F}} \quad (3)$$

$$Q = \frac{\sqrt{A_0 p_1 C_1 R_F}}{1 + R_F/R_1} \quad (4)$$

The use of amplifier poles in the transfer function of the active gm-RC filter 300 may ensure a low power operation thereof. However, the dependence of the transfer function on the op-amp 310 characteristics may require a precise control of the unity-gain frequency, $\omega_u$. Further, the active gm-RC filter 300 may require the use of active-RC, gm-C and/or like implementations to realize the real pole of odd-order transfer functions.

Figure 4A:
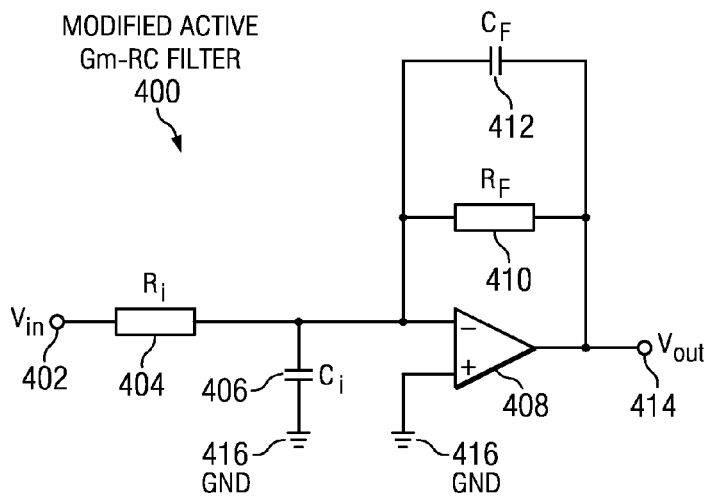
FIG. 4A is a modified active gm-RC filter, in accordance with one or more embodiments.

FIG. 4A illustrates a modified active gm-RC filter 400, in accordance with one or more embodiments. The modified active gm-RC filter 400 may include an input resistor $R_i$ 404, an input capacitor $C_i$ 406, an op-amp 408, a feedback resistor $R_F$ 410, and a feedback capacitor $C_F$ 412 in parallel with the feedback resistor $R_F$ 410. The feedback resistor $R_F$ 410 and the feedback capacitor $C_F$ 412 form a feedback loop to feed a portion of an output of the op-amp 408 to the input of the op-amp 408. $V_{in}$ 402 is the input terminal, $V_{out}$ 414 is the output terminal, and GND 416 is the ground terminal.

Figure 4B:
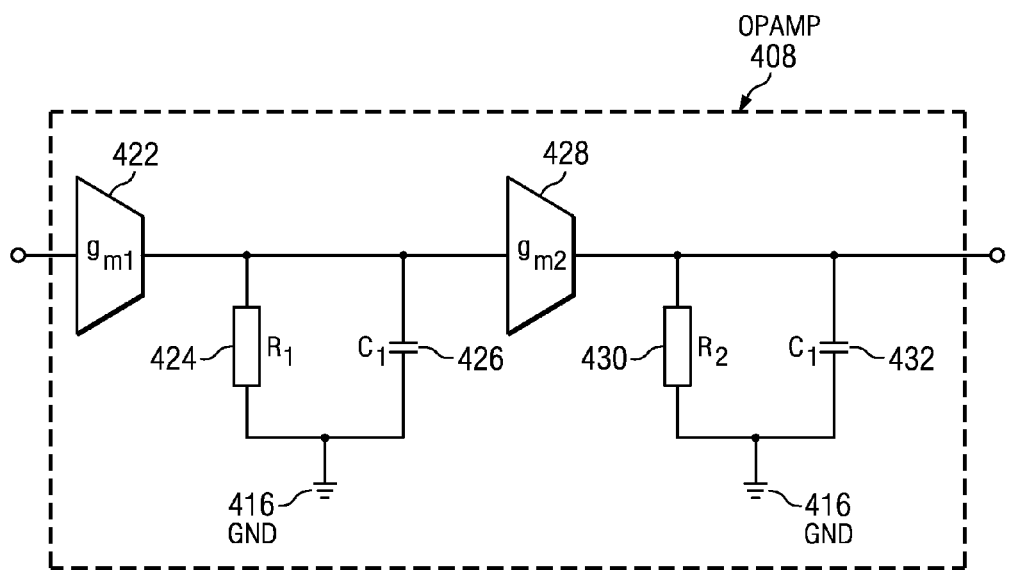
FIG. 4B is a constituent operational amplifier of the modified active gm-RC filter of FIG. 4A showing the two gm stages $g_{m1}$ and $g_{m2}$.

In one or more embodiments, the op-amp 408 may include two gain stages with transconductances $g_{m1}$ 422 and $g_{m2}$ 428, as shown in FIG. 4B, according to one or more embodiments. $R_1$ 424 and $C_1$ 426 are the input stage resistor and capacitor respectively, and $R_2$ 430 and $C_2$ 432 are the output stage resistor and capacitor respectively. In one or more embodiments, the two gain stages may internally each provide for a pole, where each pole is governed by an RC combination. The resistors $R_1$ 424 and $R_2$ 430 may dominate the output impedance of each stage. The ratio of the feedback resistor $R_F$ 410 and the input resistor $R_i$ 404 may determine the pass-band gain of the modified active gm-RC filter 400.

Thus, the poles of the modified active gm-RC filter 400 may not only depend on physical Rs and Cs but also on the poles of constituent amplifiers. In one or more embodiments, the constituent amplifiers may be differential amplifiers. The second-order transfer function of a two-stage op-amp may be expressed in example Equation 5 as:

$$A(s) = \frac{A_0}{(1 + s/p_1)(1 + s/p_2)}, \quad (5)$$

where $p_1 = 1/R_1C_1$ is the first pole, $P_2 = 1/R_2C_2$ is the second pole, and $A_0 = g_{m1}g_{m2}R_1R_2$.

In one or more embodiments, by using the second pole $P_2$ and the feedback capacitor $C_F$ 412, a third-order transfer function of the modified active gm-RC filter 400 may be obtained. Here, the need to push $p_2$ (refer to Equation 5) as far away as possible from $p_1$ in order to ensure an effective single pole differential amplifier may be dispensed with. In one or more embodiments, the third-order transfer function, $A_{III}(s)$, of the modified active gm-RC filter 400 may be expressed in example Equation 6 as:

$$A_{III}(s) = \frac{-(R_F/R_i)}{a_0 + a_1 s + a_2 s^2 + a_3 s^3}, \quad (6)$$

where $$a_0 = \left\{1 + \frac{(1 + (R_F/R_i))}{A_0}\right\},$$

$$a_1 = \left\{\left(\frac{1 + (R_F/R_i)}{A_0}\right)\left(\frac{1}{p_1} + \frac{1}{p_2} + \frac{1}{p_{fp}}\right) + \frac{1}{p_f}\right\},$$

$$a_2 = \left\{\left(\frac{1 + (R_F/R_i)}{A_0}\right)\left(\frac{1}{p_1 p_2} + \frac{1}{p_2 p_{fp}} + \frac{1}{p_1 p_{fp}}\right)\right\},$$

and $$a_3 = \left\{\left(\frac{1 + (R_F/R_i)}{A_0}\right)\left(\frac{1}{p_1 p_2 p_{fp}}\right)\right\}.$$

$$p_{fp} = \frac{1 + R_F/R_i}{(C_F + C_i)R_F} = \frac{1}{(C_F + C_i)(R_F \| R_i)}$$

is the reciprocal of the time constant due to the impedance at the input of the op-amp 408 of the modified active gm-RC filter 400, and $$p_f = \frac{1}{C_F R_F}$$

is the reciprocal of the time constant due to $R_F$ 410 and $C_F$ 412.

Equation 6 is complicated as coefficients thereof may be functions of many parameters, which may be difficult to control across Process, Voltage and Temperature (PVT) variations. In view of the aforementioned complication, Equation 6 may be simplified to an elegant filter polynomial under the following assumptions that may be conducive to the design of the modified active gm-RC filter 400.

$$\left(\frac{1+R_F/R_i}{A_0}\right) \ll 1,$$

$p_1 \ll p_2$, $p_1 \ll p_f$, $p_1 \ll p_{fp}$, and $p_f = p_{fp}$.

With the above assumptions, the third-order transfer function, $A_{III}(s)$ of the modified active gm-RC filter may reduce to an elegant filter polynomial as per example Equation 7.

$$A_{III}(s) = -\frac{-\left(\frac{R_F}{R_i}\right)}{\left(1+\frac{s}{p_f}\right)\left[1+\left(\frac{1+R_F/R_i}{A_0 p_1}\right)s+\left(\frac{1+R_F/R_i}{A_0 p_1 p_2}\right)s^2\right]} \quad (7)$$

The BW and the Q factor of the modified active gm-RC filter 400 may be expressed in example Equations 8 and 9 as:

$$BW = \sqrt{\frac{A_0 p_1 p_2}{1+R_F/R_i}} \quad (8)$$

$$Q = \sqrt{\frac{A_0 p_1 / p_2}{1+R_F/R_i}} \quad (9)$$

Equation 7 clearly demonstrates that $R_F$ 410 and $C_F$ 412 may decide the real pole, $p_f$, of the modified active gm-RC filter 400, and that the complex pole pair may be decided by the op-amp 408 poles and $A_0$. In one or more embodiments, the complex pole pair may be made to depend purely on passive elements through an intelligent choice of biasing current to the op-amp 408. All the filter poles and polynomial coefficients may, then, be purely governed by passive elements.

In one or more embodiments, bias current may be generated for the purpose of servoing $g_{m1}$ 422 and $g_{m2}$ 428 (see FIG. 4B) to a precise passive resistor. In one or more embodiments, a fixed gm bias circuit may be used to track a conductance of a resistor using a transconductor. In other words, gm may be made to be inversely proportional to a resistor.

Therefore, in the case of the modified active gm-RC filter 400, $$A_0 p_1 = \frac{g_{m1} R_1 g_{m2} R_2}{R_1 C_1} = \frac{g_{m1} g_{m2} R_2}{C_1} \propto \frac{1}{RC} \quad (10)$$

$$p_2 = \frac{1}{R_2 C_2} \propto \frac{1}{RC} \quad (11)$$

Equations 10 and 11 show that the filter poles may be governed by passive R and C, which may be tuned to obtain a desired BW and a Q factor.

Figure 4C:
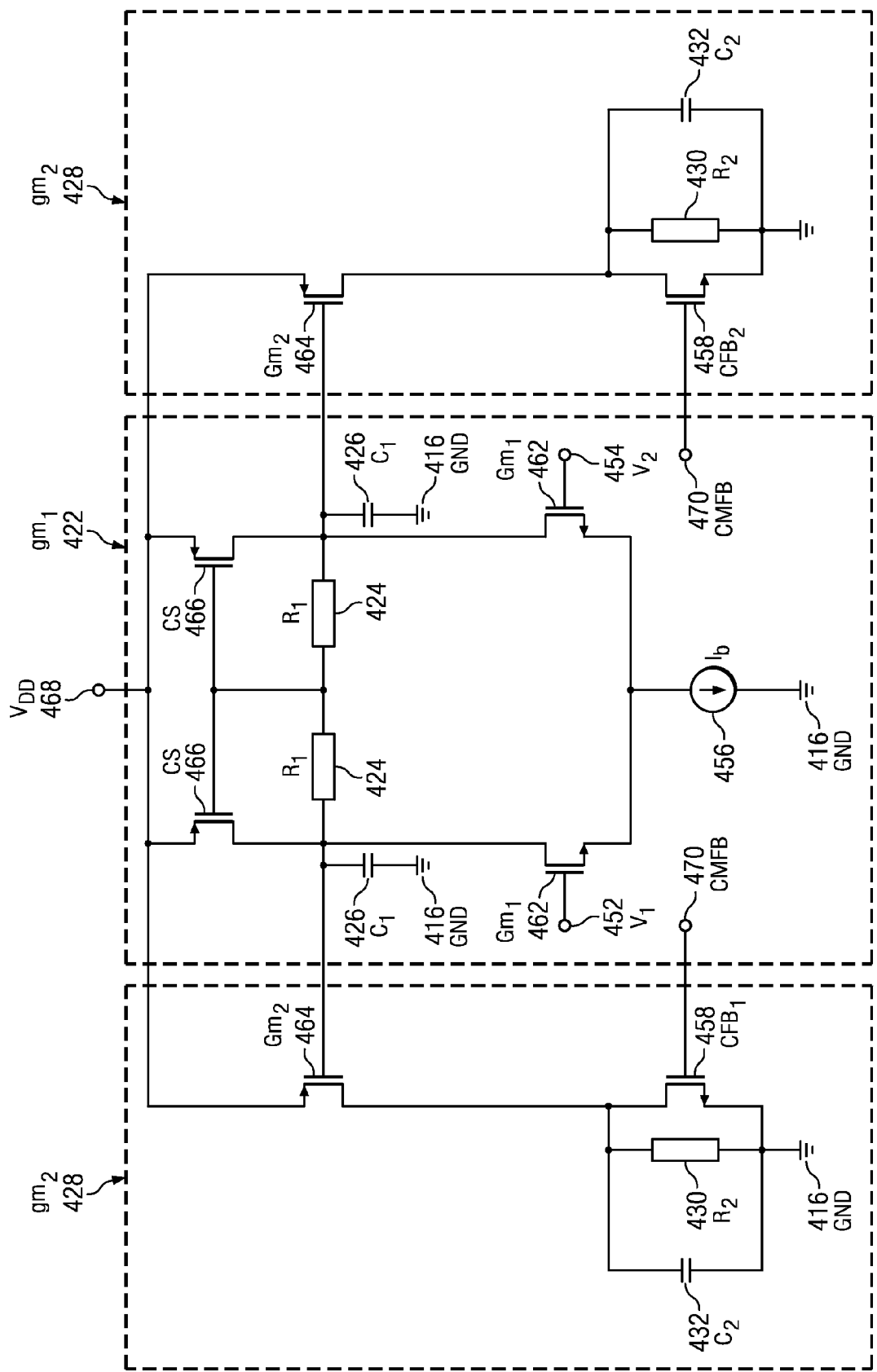
FIG. 4C is an example implementation of the operational amplifier of the modified active gm-RC filter of FIG. 4A.

FIG. 4C illustrates an example configuration of the two-stage op-amp 408 of FIG. 4B, according to one or more embodiments. In one or more embodiments, $g_{m1}$ 422 of the op-amp 408 may include a differential pair $G_{m1}$ 462 whose terminals may serve as the input terminals ($V_1$ 452 and $V_2$ 454). In one embodiment, the differential pair $G_{m1}$ 462 may include MOS transistors to whose gates the input terminals ($V_1$ 452 and $V_2$ 454) may be connected to. In one or more embodiments, $g_{m1}$ may include a bias current source $I_b$ 456. The division of $I_b$ into the differential pair elements ($G_{m1}$ 462) may be a function of the voltage difference between $V_1$ and $V_2$.

In one or more embodiments, the bias current source $I_b$ 456 may be a MOS transistor. In one or more embodiments, $g_{m1}$ 422 may include a current source load CS 466. In one or more embodiments, a current mirror (CM) or a diode connected load may be employed instead of CS 466. In one or more embodiments, combinations of the CS 466, CM or the diode connected load may be employed. In one embodiment, CS 466 may include two MOS transistors connected as shown in FIG. 4C. $R_1$ 424 and $C_1$ 426 are also connected as shown in FIG. 4C. In one or more embodiments, differential input, differential output amplifiers or differential input, single-ended output amplifiers may be employed in the stages of the op-amp 408.

In one or more embodiments, the second stage $g_{m2}$ 428, which is the output stage may include pairs of two MOS transistors ($G_{m1}$ 464 and CFB1 458, $G_{m2}$ 464 and CFB2 458) connected as shown in FIG. 4C. $R_2$ 430 and $C_2$ 432 may also be connected as shown in FIG. 4C. In one or more embodiments, Common Mode Feedback (CMFB) 470 may be applied at the gates of CFB1 458 and CFB2 458.

In one or more embodiments, $g_{m2}$ 428 may be symmetrically connected to $g_{m1}$ 422, as shown in FIG. 4C. The voltage source terminal of the op-amp 408 is shown as $V_{DD}$ 468.

In one or more embodiments, capacitive Miller compensation may be provided in the two-stage op-amp 408 of the modified active gm-RC filter 400. Even in such cases, the filter parameters may be proportional to passive elements as demonstrated in example Equations 12 and 13 as:

$$A_0 p_1 = \frac{g_{m1}}{C_c} \propto \frac{1}{RC} \quad (12)$$

$$p_2 = \frac{g_{m2}}{C_2} \propto \frac{1}{RC} \quad (13)$$

In Equation 12, $C_c$ is the compensation capacitor.

In one or more embodiments, dominant pole compensation may provide for the filter parameters being proportional to passive elements akin to Equations 10 and 11.

Thus, in one or more embodiments, an additional filter pole may be obtained using the modified active gm-RC filter 400 without the need for additional area or additional power consumption. For example, a $6^{th}$ order filtering may be obtained by merely cascading two $3^{rd}$ order filters, whereas other filtering solutions may require more filters. A single op-amp may suffice to provide for an additional filter pole that may increase the filtering obtained with the op-amp. In one or more embodiments, the modified active gm-RC filter 400 may be a building block for realizing higher-order transfer functions. In one embodiment, filters providing transfer functions of order N, with N being a positive integer and N≧2, may be cascaded with one another to realize higher-order transfer functions.

Figure 5:
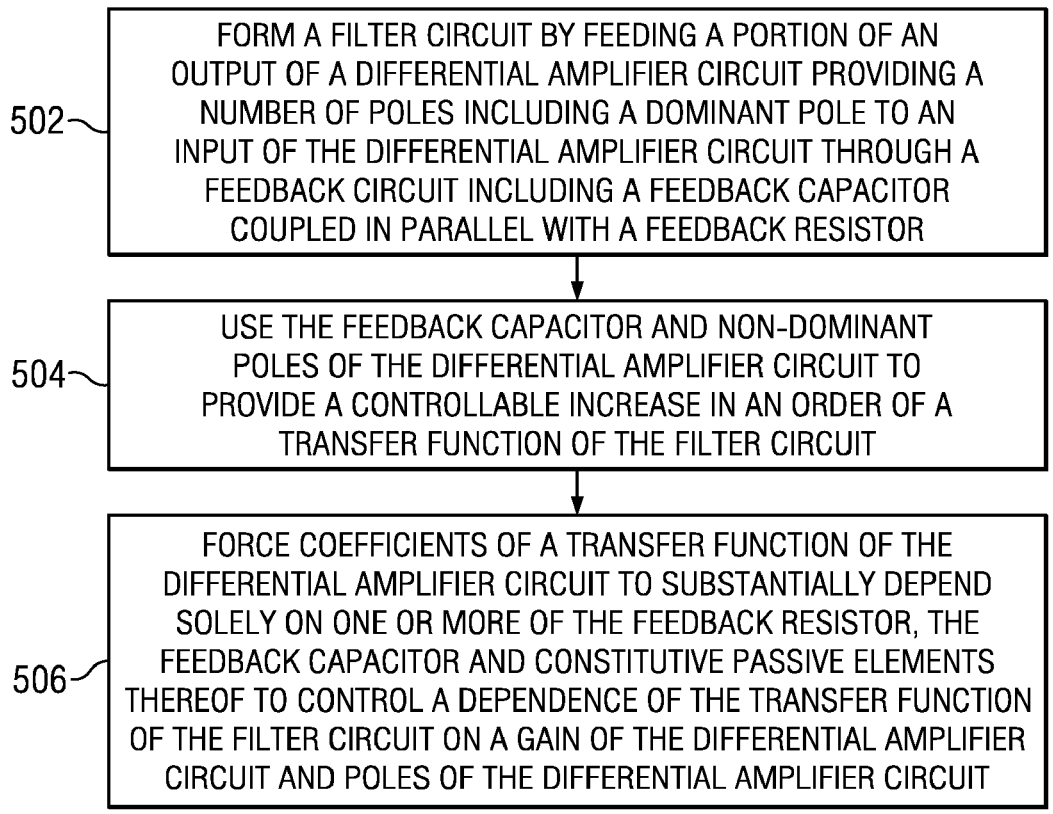
FIG. 5 is a process flow detailing the steps involved in a method of filtering, in accordance with one or more embodiments.

FIG. 5 illustrates a process flow detailing the operations involved in a method of filtering, in accordance with one or more embodiments. Operation 502 may involve forming a filter circuit by feeding a portion of an output of a differential amplifier circuit to an input of the differential amplifier circuit through a feedback circuit including a feedback capacitor coupled in parallel with a feedback resistor. In one or more embodiments, the differential amplifier circuit may provide a number of poles including a dominant pole. Operation 504 may then involve using the feedback capacitor and non-dominant poles of the differential amplifier circuit to control an increase in an order of a transfer function of the filter circuit.

Operation 506 may involve forcing coefficients of a transfer function of the differential amplifier circuit to substantially depend solely on one or more of the feedback capacitor, the feedback resistor, and constitutive passive elements of the differential amplifier circuit to control a dependence of the transfer function of the filter circuit on a gain of the differential amplifier circuit and poles of the differential amplifier circuit. In one or more embodiments, the constitutive passive elements of the differential amplifier circuit may include one or more of a resistor and a capacitor.

In one or more embodiments, higher order transfer functions may be realized using multi-stage differential amplifiers with multiple poles, of which one may be dominant and others may be non-dominant. For example, a filter providing a transfer function of order N may be cascaded with a filter providing a transfer function of order M, where N≧2, M≧1, N and M are positive integers, and N and M are different from each other. In one or more embodiments, the modified active gm-RC filter 400 may be a part of an integrated circuit, where the modified active gm-RC filter 400 is used to filter an output of an electrical circuit included in the integrated circuit.

In addition, it will be appreciated that the various operations, processes, and methods disclosed herein may be embodied in a machine-readable medium and/or a machine accessible medium compatible with a data processing system (e.g., a computer system), and may be performed in any order (e.g., including using means for achieving the various operations). The transistors, bias sources, configurations of the two stages of the op-amp 408, filter-order etc. of the modified active gm-RC filter 400 may be modified, and the aforementioned modifications are well within the scope of the exemplary embodiments. Accordingly, the specification and drawings are to be regarded in an illustrative rather than a restrictive sense.

What is claimed is:

1. A filter circuit comprising:
   an amplifier circuit to provide a plurality of poles including a dominant pole, wherein the amplifier circuit comprises at least two gain stages that provide the plurality of poles;
   a feedback circuit to feed a portion of an output of the amplifier circuit to an input of the amplifier circuit, the feedback circuit comprising:
      a feedback resistor; and
      a feedback capacitor to provide a controllable increase in an order of a transfer function of the filter circuit along with non-dominant poles of the amplifier circuit coupled in parallel with the feedback resistor; and
   a plurality of passive circuit elements including at least one of a resistor and a capacitor coupled to at least one of the two gain stages, with coefficients of the transfer function of the amplifier circuit being forced to depend on at least one of the plurality of passive circuit elements, the feedback resistor, and the feedback capacitor to control a dependence of the transfer function of the filter circuit on a gain of the amplifier circuit and poles of the amplifier circuit.

2. The filter circuit of claim 1, further comprising an input Resistor-Capacitor circuit, coupled to an input of the amplifier, that forces a time constant due to impedance at an input of the amplifier circuit to equate to a time constant due to the feedback resistor and the feedback capacitor.

3. The filter circuit of claim 1, wherein the amplifier circuit comprises a transconductance amplifier.

4. The filter circuit of claim 1, wherein the differential amplifier circuit is an operational amplifier.

5. The filter circuit of claim 1, wherein a plurality of filter circuits are cascaded together with the filter circuit to create a higher order filter circuit.

6. The filter circuit of claim 1, wherein the differential amplifier circuit includes a frequency compensation to provide the dominant pole.

7. The filter circuit of claim 2, wherein at least one of the feedback resistor and the resistor of the input Resistor-Capacitor circuit is tuned to change a closed-loop gain of the differential amplifier circuit.

8. The filter circuit of claim 3, wherein the filter circuit is an active transconductance-Resistor-Capacitor filter, with a feedback loop from an output of one of the gain stages to the input of the respective gain stage, wherein the feedback loop comprises a capacitor in parallel with a resistor.

9. The filter circuit of claim 3, further comprising a bias circuit, coupled to the amplifier, to track a conductance of a resistor using a transconductor.

10. The filter circuit of claim 6, wherein the frequency compensation is one of a Miller compensation and a dominant-pole compensation.

11. The filter circuit of claim 1, wherein each of the at least two gain stages comprises:
   at least one of a current source load, a current mirror, and a diode connected load and a resistor; and
   at least one of a differential pair and an input transistor, wherein the differential pair comprises a bias current source.

12. The filter circuit of claim 11, wherein the other gain stage of the at least two gain stages comprises Common Mode Feedback applied at a terminal thereof.

13. A method of filtering comprising:
   forming a filter circuit by feeding a portion of an output of an amplifier circuit comprising at least two gain stages to provide a plurality of poles including a dominant pole to an input of the amplifier circuit through a feedback circuit including a feedback capacitor coupled in parallel with a feedback resistor;
   using the feedback circuit and non-dominant poles of the amplifier circuit to provide a controllable increase in an order of a transfer function of the filter circuit; and
   coupling constituent passive circuit elements to one of the at least two gain stages to force coefficients of the transfer function of the amplifier circuit to depend on at least one of the feedback resistor, the feedback capacitor, and the constituent passive circuit elements thereof collated to the amplifier circuit, the passive circuit elements including at least one of a resistor and a capacitor, to control a dependence of the transfer function of the filter circuit on a gain of the amplifier circuit and poles of the amplifier circuit.

14. The method of claim 13, comprising providing an input Resistor-Capacitor circuit, coupling an output of one of the gain stages to the input of the respective gain stage, to force a time constant due to impedance at the input of the amplifier circuit to equate to a time constant due to the feedback resistor and the feedback capacitor.

15. The method of claim 13, further comprising cascading a plurality of filter circuits with the filter circuit to create a higher order filter circuit.

16. The method of claim 13, further comprising providing a bias circuit to track a conductance of a resistor using a transconductor.

17. The method of claim 13, further comprising utilizing a frequency compensation to provide the dominant pole.

18. An integrated circuit comprising:
    an electrical circuit; and
    a filter circuit to filter an output of the electrical circuit, the filter circuit comprising:
        an amplifier circuit to provide a plurality of poles including a dominant pole, wherein the amplifier circuit comprises at least two gain stages that provide the plurality of poles;
        a feedback circuit to feed a portion of an output of the amplifier circuit to an input of the amplifier circuit, the feedback circuit comprising:
            a feedback resistor: and
            a feedback capacitor to provide a controllable increase in an order of a transfer function of the filter circuit along with non-dominant poles of the amplifier circuit coupled in parallel with the feedback resistor; and
        a plurality of passive circuit elements including at least one of a resistor and a capacitor coupled to the at least two gain stages, with coefficients of the transfer function of the amplifier circuit being forced to depend on at least one of the plurality of passive circuit elements, the feedback resistor, and the feedback capacitor to control a dependence of the transfer function of the filter circuit on a gain of the amplifier circuit and poles of the amplifier circuit.

* * * * *